$\text{US010115467B2}$

(12) United States Patent
Liu et al.

(10) Patent No.: US 10,115,467 B2
(45) Date of Patent: Oct. 30, 2018

(54) ONE TIME ACCESSIBLE (OTA) NON-VOLATILE MEMORY

(71) Applicant: JONKER LLC, Zephyr Cove, NV (US)

(72) Inventors: David K. Y. Liu, Fremont, CA (US); John Nicholas Gross, Berkeley, CA (US)

(73) Assignee: Jonker LLC, Zephyr Cove, NV (US)

( * ) Notice: Subject to any disclaimer, the term of this patent is extended or adjusted under 35 U.S.C. 154(b) by 0 days.

(21) Appl. No.: 14/865,971

(22) Filed: Sep. 25, 2015

(65) Prior Publication Data
US 2016/0093395 A1 Mar. 31, 2016

Related U.S. Application Data

(60) Provisional application No. 62/057,856, filed on Sep. 30, 2014.

(51) Int. Cl.
| | |
|---|---|
| *G11C 16/26* | (2006.01) |
| *G11C 16/14* | (2006.01) |
| *G11C 13/00* | (2006.01) |
| *G11C 16/22* | (2006.01) |

(52) U.S. Cl.
CPC ........ *G11C 16/26* (2013.01); *G11C 13/0004* (2013.01); *G11C 13/004* (2013.01); *G11C 13/0059* (2013.01); *G11C 13/0097* (2013.01); *G11C 16/14* (2013.01); *G11C 16/22* (2013.01); *G11C 2013/0047* (2013.01)

(58) Field of Classification Search
CPC ..... G11C 16/26; G11C 13/0097; G11C 16/14; G11C 13/004; G11C 16/22; G11C 13/0004
See application file for complete search history.

(56) References Cited

U.S. PATENT DOCUMENTS

| | | | |
|---|---|---|---|
| 4,409,670 A | 10/1983 | Herndon et al. | |
| 6,282,120 B1 * | 8/2001 | Cernea | G11C 11/5621 365/185.2 |
| 6,345,000 B1 | 2/2002 | Wong et al. | |
| 6,625,734 B1 | 9/2003 | Marvit et al. | |
| 7,092,288 B2 | 8/2006 | Lojek | |
| 7,199,394 B2 | 4/2007 | Mandell et al. | |
| 7,260,672 B2 | 8/2007 | Garney | |

(Continued)

FOREIGN PATENT DOCUMENTS

CN 103730164 A 4/2014

OTHER PUBLICATIONS

Aritome, S., et al., "Reliability Issues of Flash Memory Cells," Proc. IEEE, vol. 81, No. 5, May 1993.
(Continued)

*Primary Examiner* — Douglas King
(74) *Attorney, Agent, or Firm* — Law Office of J. Nicholas Gross, P.C.

(57) ABSTRACT

A programmable non-volatile memory device effectuates two different functions (read, erase (re-program)) during a single instruction or command. During a first phase of the command a cell state is determined by a memory controller circuit, and in a second phase of the same command the cell state is re-written. This implementation is useful for applications where it is desirable to permit one time access only of particular data/content.

24 Claims, 3 Drawing Sheets

(56) References Cited

U.S. PATENT DOCUMENTS

| | | | |
|---|---|---|---|
| 7,273,766 | B1 | 9/2007 | Lan et al. |
| 7,489,542 | B2 | 2/2009 | Chen et al. |
| 7,679,945 | B2 | 3/2010 | Rizzo et al. |
| 7,881,108 | B2 | 2/2011 | Cornwell et al. |
| 8,327,068 | B2 | 12/2012 | Nakanishi et al. |
| 8,331,128 | B1 | 12/2012 | Derhacobian et al. |
| 8,374,746 | B2 | 2/2013 | Plante |
| 8,456,880 | B2 | 6/2013 | Norman |
| 8,488,397 | B2 | 7/2013 | Elfadel et al. |
| 8,745,347 | B2 | 6/2014 | Ferren et al. |
| 8,817,530 | B2 | 8/2014 | Alam et al. |
| 8,909,725 | B1 | 12/2014 | Sehn |
| 2004/0047202 | A1* | 3/2004 | Tanzawa ............... G11C 7/18 365/201 |
| 2005/0051053 | A1 | 3/2005 | Wisnudel et al. |
| 2006/0126484 | A1 | 6/2006 | LeBlanc et al. |
| 2007/0127293 | A1* | 6/2007 | Hung ............... G11C 16/0491 365/185.18 |
| 2007/0233955 | A1 | 10/2007 | Luo et al. |
| 2008/0162869 | A1 | 7/2008 | Kim et al. |
| 2009/0046499 | A1* | 2/2009 | Philipp ............... G11C 13/0004 365/163 |
| 2009/0208692 | A1 | 8/2009 | Lindholm et al. |
| 2011/0138192 | A1* | 6/2011 | Kocher ............... G06F 21/602 713/189 |
| 2012/0208595 | A1 | 8/2012 | Norman |
| 2012/0292613 | A1 | 11/2012 | Shionoiri et al. |
| 2013/0070530 | A1 | 3/2013 | Chen et al. |
| 2013/0265830 | A1 | 10/2013 | Bisen |
| 2013/0290443 | A1 | 10/2013 | Collins et al. |
| 2013/0346805 | A1 | 12/2013 | Sprouse et al. |
| 2014/0068183 | A1 | 3/2014 | Joshi et al. |

OTHER PUBLICATIONS

Gao, W. and W. Martin Snelgrove, "The floating gate MOS device as an analogue trimming element," Microelectronics Journal, vol. 25, No. 5, pp. 353-361, Aug. 31, 1994.

Geldman, J., "Sanitize Command," Technical Committee T13: AT Attachment, Internet. Available at http://www.t13.org/.../e07197r7-T13_Sanitize_Command_Proposal.pdf, Jun. 10, 2008.

Gerber, A., et al., "Low-Voltage Operation of Metal-Ferroelectric-Insulator-Semiconductor Diodes Incorporating a Ferroelectric Polyvinylidene Fluoride Copolymer Langmuir-Blodgett Film," Stephen Ducharme Publications, Paper 30, Jul. 26, 2006.

Huang, Yifei, "Amorphous Silicon TFT Based Non-Volatile Memory" Diss. Internet. Available at https://www.princeton.edu/sturm/publications/phd-theses/pdfs/Part%20II%20Yifei_Huang_thesis.pdf. Last visited Jan. 20, 2016.

Kim, J. H., et al., "Charge Loss Mechanisms in a Stacked-Gate Flash EEPROM Cell with an ONO Inter-Poly Dielectric," J. Korean Physical Soc., vol. 39, No. 6, pp. 1103-1106, Dec. 6, 2001.

Kissel, Richard, et al., "Guidelines for Media Sanitization," NIST Special Publication 800-88, Rev. 1, Dec. 2014.

Patrizio, A., "DVDs That Self-Destruct," Wired, Jan. 20, 2000.

Postel-Pellerin, J., et al. "Charge Loss Activation During Non-Volatiles Memory Data Retention," CAS International 2012, vol. 2., pp. 377-380, Oct. 15-17, 2012.

Reece, T., "Characterization of Metalferroelectric-Insulator-Semiconductor Structures Based on Ferroelectric Langmuir-Blodgett Polyvinylidene Fluoride Copolymer Films for Nondestructive Random Access Memory Applications," Theses, Dissertations, and Student Research: Department of Physics and Astronomy, University of Nebraska—Lincoln, Dec. 6, 2007.

Sakai, Shigeki and Mitsue Takahashi, "Recent Progress of Ferroelectric-Gate Field-Effect Transistors and Applications to Nonvolatile Logic and FeNAND Flash Memory," Materials, vol. 3., pp. 4950-4964, Nov. 18, 2010.

Swanson, Steven and Michael Wei, "SAFE: Fast, Verifiable Sanitization for SSDs Or: Why Encryption Alone is not a Solution for Sanitizing SSDs," Non-Volatile Systems Laboratory, Computer Science and Engineering, Univ. Calif. San Diego, Oct. 13, 2010.

Vasileska, Dragica, "Modeling of Non-Volatile Memories with Silvaco," Arizona State University, Jul. 6, 2011.

Wei, M., et al. "Reliably Erasing Data from Flash-Based Solid State Drives." FAST. vol. 11. 2011.

Zhao C., et al. "Review on Non-Volatile Memory with High-k Dielectrics: Flash for Generation Beyond 32 nm," Materials, vol. 7, pp. 5117-5145, Jul. 15, 2014.

* cited by examiner

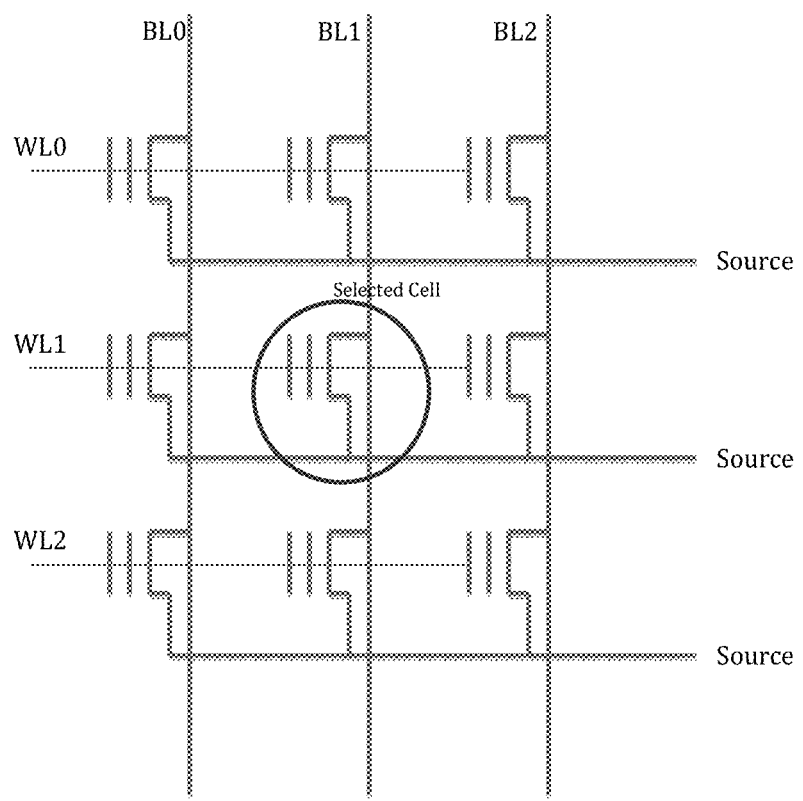
Figure 1. Cell array with selected cell highlighted

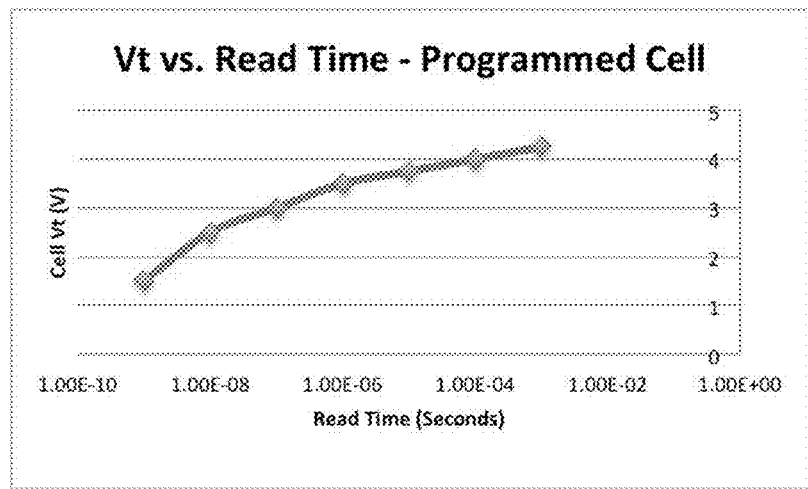
Figure 2. Vt of a Programmed cell as a function of Read time
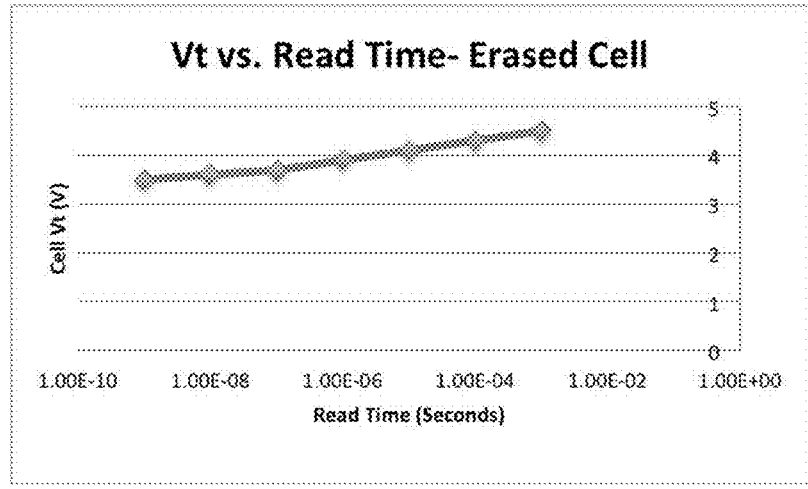
Figure 3. Vt of an Erased cell as a function of Read time

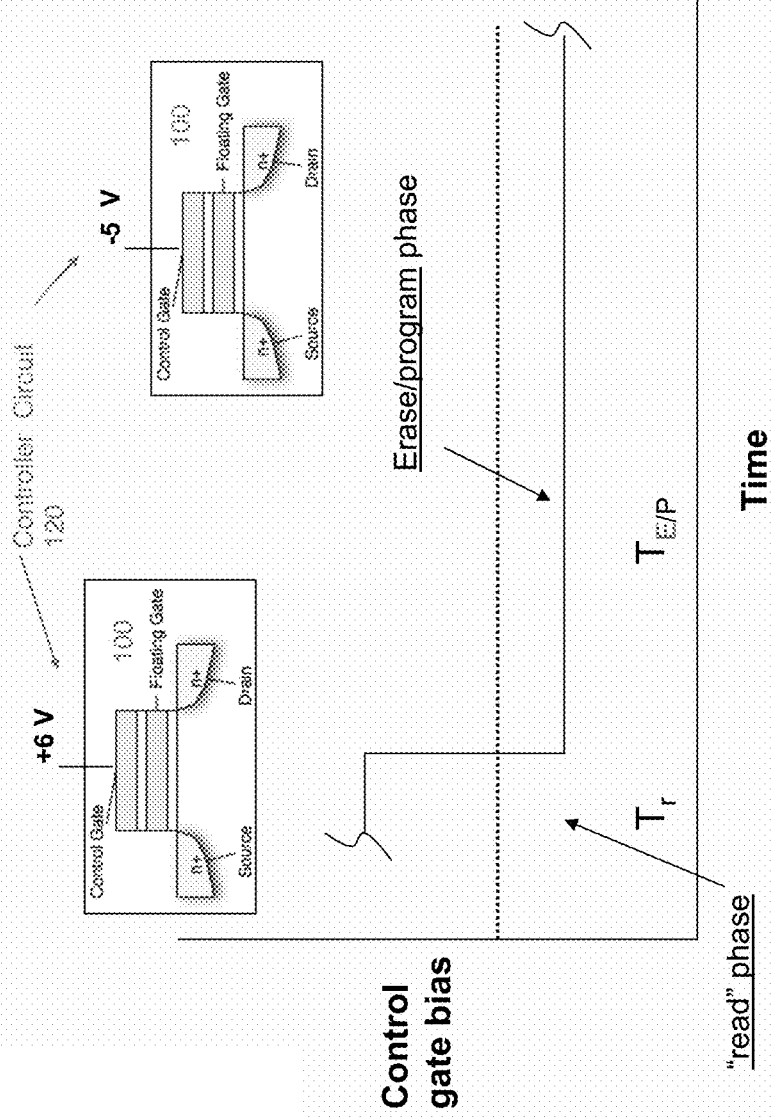

ONE TIME ACCESSIBLE (OTA) NON-VOLATILE MEMORY

RELATED APPLICATION DATA

The present application claims the benefit under 35 U.S.C. 119(e) of the priority date of Provisional Application Ser. No. 62/057,856 filed Sep. 30, 2014 which is hereby incorporated by reference.

FIELD OF THE INVENTION

The present invention relates to non-volatile memory devices which can be operated so that reading their logic state affects the underlying data. The invention has particular applicability to applications where is it desirable to access data on a one-time basis.

BACKGROUND

Conventional nonvolatile memory cells, such as OTP, EPROM, flash memory, or even PCM, are designed and in fact usually optimized to retain their data not only at ambient storage condition, but also during other device operations, including at data accessing conditions. That is, a read operation, or a data accessing operation, is typically performed under very benign biasing conditions to avoid any inadvertent change to the stored data. For example, in a typical floating gate nonvolatile memory cell, typically electrons that have been injected unto the floating gate (from a channel created between a source and drain region of the cell) are used as the stored data. The presence or absence of electrons on the floating gate defines a logic value corresponding to either a "1" state or a "0" state, or vice versa.

The cells are engineered so that these electrons are retained on the floating gate during either the idle/quiescent storage conditions or during the read operations. Read operations implemented by conventional flash memory controllers are designed such that no additional electrons are either injected unto the floating gate, or taken out of the floating gate. This way, the integrity of the stored data is preserved with data accessing operations. See e.g., US Publication No 2013/0346805 incorporated by reference herein. This feature of "access" non-volatility is highly desirable in applications where the same storage data is accessed many times, such as the case of stored program codes or other frequently accessed data which is not intended to be changed. However, there is a need in the art for memory devices that can service other applications in which continued access to data is not necessary, or in fact, is undesirable.

SUMMARY OF THE INVENTION

An object of the present invention, therefore, is to overcome the aforementioned limitations and conventions of the prior art. A non-volatile memory cell device is (which can be floating gate based device) stores a logic state based on a value of a charge physically present in a memory cell, such that a first amount of charge represents a first logical value, and a second amount of charge represents a second logical value. A hybrid read operation implemented on the device (preferably a single integrated circuit) is configured to effectuate, either simultaneously or through a two-step process, both: i) a read of the stored memory cell logic state during a first phase; and ii) an erase of the stored memory cell logic state during an immediately subsequent second phase.

A programmable onboard controller effectuates the bias conditions necessary for the hybrid or modified read operation. Aspects of the invention therefore are directed to both the circuits and methods that bring about the new type of read operation. In some embodiments phase change materials based cells can be used as well for a memory array.

It will be understood from the Detailed Description that the inventions can be implemented in a multitude of different embodiments. Furthermore, it will be readily appreciated by skilled artisans that such different embodiments will likely include only one or more of the aforementioned objects of the present inventions.

Thus, the absence of one or more of such characteristics in any particular embodiment should not be construed as limiting the scope of the present inventions. While described in the context of a non-volatile memory device, it will be apparent to those skilled in the art that the present teachings could be used in any number of related applications.

DESCRIPTION OF THE DRAWINGS

FIG. 1 depicts a cell array with a selected cell highlighted in a preferred embodiment of a non-volatile memory device of the present invention;

FIG. 2 shows a preferred Vt of a programmed cell as a function of read time in a preferred embodiment of a non-volatile memory device of the present invention;

FIG. 3 shows a preferred Vt of an unprogrammed cell as a function of read time in a preferred embodiment of a non-volatile memory device of the present invention;

FIG. 4 illustrates a timing diagram of biasing applied during a preferred read operation embodiment of the present invention.

DETAILED DESCRIPTION

The inventors posit a new type of data storage device and access operation, in which data in a memory cell is (effectively) ensured to be erased after it is read, to prevent further access to the original data. As noted below, the inventors believe that there are many new and recent (as well as future) applications where it is desirable (or even necessary) to allow the cell/device data only to be accessed once, and thereafter the data be made no longer available after a first (and only) one time access (OTA) operation is performed. Example applications where an OTA feature is useful include pay-per-view music or movie data, OTA tokens, and other one-time use applications, including facility temporary access applications (single access authorization cards, pass coded tickets, pass coded electronic keys, etc.) secure communications (disappearing email, photos, etc.) certain types of data caches, receive/transmit data buffers, etc. Military and security applications which require periodic data sanitizing are also potential applications. Accordingly the invention(s) address a clear long-felt need left unsolved in the prior art, and enables solutions for new types of applications as well.

One method of achieving this one time access feature is through issuing and performing a new hybrid command, preferably with an onboard memory controller, to erase or re-set the stored data on the memory cells, substantially immediately right after or subsequent to a read operation. In other words, the memory controller is configured to implement a novel hybrid read command, which includes a separate conventional erase operation performed right after a conventional read operation on the data in question during a second access of the cell. This can be effectuated by a simple modification of the array read/write/erase controller firmware implemented in the memory controller.

This first type of One-Time access implementation can work well in applications which do not require an extremely high level of security, and when there is reasonable certainty that the firmware program will be executed properly and completely. In this first embodiment, there is no guaranteed mechanism however to ensure that the erase command is actually carried out after the read operation, since it is conceivable that the erase command can be interrupted right after accessing the data so that it is not carried out completely. For example a power failure or other electrical glitch could interfere with the follow up erase operation. Accordingly, it is possible that the data is still retained and available on the memory cells, thus making it possible for further undesirable access of the data. Even such residual data, however, can be addressed through conventional data sanitizing operations known in the art.

A second embodiment discussed at length herein addresses reading the content of stored data in a nonvolatile memory cell such that the reading or accessing operation itself is modified so that it inherently causes the data to be removed or erased as well, in a form of integrated operation.

In other words, the memory controller is configured to implement a second type of novel hybrid read command, which includes a new type of operation in which charge is both read and removed during a single access cycle/period. As with the first embodiment, this can be effectuated by a simple modification of the array read/write/erase controller firmware implemented in the memory controller. Since it is extremely difficult to interfere with firmware level operations during this single access, the second embodiment's hybrid "erase as part of read" command should be extremely secure.

This second approach ensures that the data can only be accessed once from the systems. Furthermore this method can be applied in different types of Nonvolatile memory, including floating gate storage cells and Phase Change Memory cells.

The concept of a destructive-read command implemented herein hinges on transforming a read command so that—in addition to a read operation—it is also effectuates an operation that erases data (or re-programs them effectively to an initial unprogrammed Vt state) stored in the nonvolatile memory cell. The main feature of the present disclosure therefore is to take advantage of operations previously known to selectively place electrons on the cell, and convert them effectively into an erase operation.

So as to be consistent and reliable like prior read methods, however, a destructive read operation should similarly only remove stored data on cells that are selected for reading. That is, there should be no read-disturb on non-selected cells during the destructive read access operation. Otherwise the data on cells that are yet to be accessed, but sharing the same bitlines or wordlines could also be erased. In the present case, by using channel hot electron injection, which is a more bit-specific process, an erase can be implemented that does not substantially or adversely affect a logic state of adjoining cells. This concept should be applicable to many of the most common types of nonvolatile memory cells, and this invention will use the examples of both floating gate memory cells and the Phase Change Memory cells.

In a preferred embodiment of implementing this innovation with a conventional floating gate flash memory cell, one can define a high Vt state, or state with injected electrons on the floating gate to be a logical erased or reset state. A cell with low Vt or UV Vt can be considered as a logical programmed state.

A bulk erase operation is done with a programmed memory controller by applying a high voltage on the control gate of all cells with their associated source, drain regions, and substrate all held at 0V. Under such conditions a cell's threshold voltage will be raised to greater than a certain voltage level, for example greater than 3.5V. This high Vt state represents an erased state, or a logical "0" state. It will be understood that other values will be useful or necessary in other applications, and depending on the cell/array design.

A programming operation is done with the programmed memory controller by applying a voltage of −5V on a selected wordline and a voltage of 5V on a selected bit line to facilitate removal of electrons on the floating gate of the selected cell to bring the Vt down to somewhere preferably below 2.0V. This low Vt state represents a programmed state, or a logical "1" state. It will be understood of course that other techniques are possible for bulk erase and program, and will vary according to the specific cell implementation.

During the improved "destructive" read operation of the present disclosure, bias conditions are selected and imposed by a memory controller to favor a fast injection of additional channel hot electrons to bring a cell to a Vt greater than 3.5V immediately after a read, regardless of an initial threshold voltage on the cell. The two phases of this new read operation are illustrated in FIG. 4, which identifies a typical floating gate based cell 100 with control gate, floating gate, source/drain regions and a channel. A memory controller circuit 120 implements the biasing conditions for the cell as set out herein. As noted above, because CHEI is mostly bit-specific, it affords an erase of individual cells without disturbing other adjacent cells (FIG. 1).

Thus as seen in FIG. 4 a novel preferred read operation implemented by control circuit 120 preferably places a control gate voltage of 6V and a drain voltage of 5V on the selected cell, with the source and the substrate biased at 0V during a first phase ($T_R$). As is known, a cell may be in a programmed (single or multi-level bit) or unprogrammed state. For a cell that is originally in a programmed state, or a low Vt state, the cell initially has a large amount of drain current when it is read (to detect a logical 1 (or other multi-level) value), and almost right away electrons are injected by the control circuit 120 unto the floating gate (during a second phase $T_E$), causing the current to drop almost instantaneously. Conversely, during the read operation a cell that initially has a high Vt (an unprogrammed cell) would not see or demonstrate such drastic reduction (or change) in the drain current since the cell already has injected electrons from the previous erase operation, and does not conduct very much drain current in the first phase. The result is an integrated read instruction-command in which both a read and an erase (or re-program to an initialized state) operation are achieved during a single period of access/addressing the cell.

The original stored data on the cell can be sensed during a first phase of the integrated operation in at least one of two ways, either by: 1) integrating a total charge flowing through the cell during an entire erase cycle (i.e., the total charge flowing through a logic "0" bit will be significantly different than that flowing through a logic "1" (or multi-level) bit during the access and can be easily measured); and/or 2) detecting how a total change in drain current occurs as a function of time (i.e., the current flowing through the cell should change dramatically for a logic "1" bit vs a logic "0" bit). The second sensing method can be implemented in a conventional differential-pair sensing scheme (not shown) in which the current of the selected cell is compared with an erased referenced cell, and the initial difference in current can be latched and read as a valid data, prior to the selected cell being erased. Regardless of an initial stored data value, or cell's threshold voltage, in this fashion, once a cell is accessed, all such cells are set to a high Vt level, or at an erased level during a second phase. Both sensing techniques are possible and it will be understood that the particular implementation will vary according to system, speed requirements. This permits the data to be reset during the process of accessing the data. Accordingly, in preferred embodiments, once a cell is read, the original data is destroyed, and the state of the cell is thereafter at an erased state (until re-programmed of course).

Since the read operation is done under bias conditions that bring about traditional channel hot electron injection mode, the effects on the device are well known and should be minimal. This implementation achieves a Nonvolatile memory array that is durable, has a reasonably good data retention lifetime during ambient storage, and offers write/program with only One-Time-Accessibility.

Table 1 below illustrates preferred bias conditions imposed on the cells in a typical memory array during various operations by control circuit 120, for both selected and unselected cells. It should be noted that the regular erase operation referenced below is done in bulk, or by blocks, while the reading and programming operations are preferably done on the selected bytes or bits. The various bias voltages, timings for the various phases, etc., are implemented by a controller circuit 120 which can be configured using conventional techniques to effectuate the necessary signals for the memory access commands. While the example is given for a single logic level cell, it will be understood that other bias conditions and cell types may be used to implement multi-level values.

TABLE 1

| Operation | Selected Drain | Unselected Drain | Selected Gate | Unselected Gate | Source | Substrate |
|---|---|---|---|---|---|---|
| Erase | 0 V | 0 V | 10 V | 10 V | 0 V | 0 V |
| Program | 5 V | 0 V | −5 V | 0 V | 0 V | 0 V |
| Read | 5 V | 0 V | 6.0 V | 0 V | 0 V | 0 V |

In terms of characterizing the cell behavior as a function of a read or accessing operation, we illustrate the characteristics of the cells as a function of the reading time on the cell to demonstrate the operation of the preferred embodiments. FIG. 1 illustrates the memory cells in a NOR array configuration, with the selected cell being the cell addressed by WL1 and BL1, in accordance with Table 1. Again, because CHEI is used to erase the cells after they are read, secondary disturbs should be minimal on other adjacent cells.

FIG. 2 shows the Vt of a programmed cell at low Vt state, or a "1" state, as a function of the access time when the read voltages are applied on this cell. It is seen that the initial low Vt of the cell (i.e., below about 2 v in this instance) is is detected at the beginning or first phase of a read/accessing operation. During this time the data is sensed and its logical value (1, 0) preferably determined by a conventional sensing circuit techniques, which may include the use of differential pair sensing circuitry, as mentioned above. As the reading or accessing operation continues to a second phase, during which significant channel hot electrons have been injected, and the initial Vt of the cell starts to move to a higher Vt due to the injection of the channel hot electrons unto the floating gate.

At end of approximately 10 us (microsecond) (actual results will vary according to particular implementations and can be determined through routine experimentation or simulation), the cell Vt has already moved to a higher Vt than an erased Vt, or a logical "0" state Vt. Thus the cell is effectively erased during a single access which includes the reading operation. It should be noted that as long as the sensing circuit can detect a significant amount of (or change in) current within the first phase of the read operation—in this example, about 10 ns (nanosecond)—the state of the cell can be correctly read and determined to be a "1" state (or a multi-level state in some instances).

Note in some implementations (as alluded to above) the "erase" phase of the read can proceed independently in the background (during a second access) after the cell is read, so that access speed is not unduly compromised. Furthermore from a housekeeping—operational complexity perspective embodiments of the invention offer other unique advantages. For example since all cells are effectively kept or maintained at an erased state, regardless of their original underlying data, a program operation does not have to be preceded with an erase operation as is required in some implementations. In addition from a device wear and leveling perspective, a greater population of cells are maintained in a common and predictable erased state which should improve device longevity.

FIG. 3 shows the Vt of an already erased cell (logical 0 state) that is being read or accessed by memory control circuit 120. As is observed from the figure, the cell continues to increase slightly in Vt, making it more robust in the erased state, or the "0" state. Through the duration of the reading operation, the state of the cell is determined to be a "0" state cell.

In this implementation of accessing the content of the memory cell array, the stored "0" data of the cell is again sensed correctly in the initial first phase portion of the read time (first 10 ns), as can be seen by the fact that the drain current is small to begin with, and does not change significantly—in contrast to a cell with an initial logical 1 state. Thereafter the memory cell is placed again) into an erased state, or the "0" state, regardless of the initial content of the memory cells.

Therefore in both cases, regardless of an initial cell state, a one time accessibility is achieved in the second embodiment during a single access since the content of the cell is always destroyed and reset to an erased state during any read operation on the cell. This approach can help solve at least one significant problem now in the art, namely, the fact that mobile phone apps (e.g. Snapchat, Cyberdust) that purport to delete user texts, images, etc., do not actually physically or permanently delete such data. Rather, they remove pointers to such data, or rename the files in question to make them less discoverable at a logical/software layer level. Moreover embodiments of the invention still retain data after power is removed/lost, and are thus superior to any prior art DRAM based techniques that may mimic such functionality. It will be understood that the invention is also compatible with and can be used with encrypted messages/data as well.

In some embodiments it may be desirable to couple the read data from the array into a separate conventional memory (which also may be NVM) buffer (not shown) of a predetermined size. That way, in the event of an inadvertent disruption or failure in the read/access process for a relative large file (which normally require a re-read of the data) the most recent data (whose size can be configured for a particular application) can still be reliably read by an external circuit, device, etc. For example in a movie context, a few minutes of content may be buffered, while for music applications a few seconds, and so on.

What is claimed is:

1. A method of operating a floating gate based non-volatile memory cell device that operates to store a logic state based on a value of a charge physically present on the floating gate in a memory cell, such that a first amount of charge represents a first logical value, and a second amount of charge represents a second logical value, the improvement comprising:
a hybrid read operation that when effectuated:
i. reads the stored memory cell logic state during a first phase; and
ii. erases the stored memory cell logic state during an immediately subsequent second phase;
iii. senses said stored memory cell logical state by at least one of: 1) integrating a total charge flowing through the device during at least a portion of time of said hybrid read operation; and/or 2) detecting a change in current as a function of at least a portion of time of said hybrid read operation for said memory device;
wherein a threshold voltage of the floating gate based memory cell device is caused to increase during an entirety of said hybrid read operation;
further wherein a stored logic state of the non-volatile memory cell device can be read at most once before it is erased.

2. The method of claim 1 wherein the non-volatile memory (NVM) cell device is erased by storing electrons on the floating gate.

3. The method of claim 2 wherein electrons are added to the floating gate during said immediately subsequent second phase.

4. The method of claim 3 wherein said electrons are added by channel hot electron injection.

5. The method of claim 1 wherein only a single access to the memory cell is required to effectuate achieve both a read and erase operation.

6. The method of claim 1 where a differential pair sense amplifier is used to detect the content of the memory cell.

7. The method of claim 1 wherein a threshold voltage Vt of each memory cell in a memory array of the device is restored to an unprogrammed level after each read of the contents of such cell.

8. The method of claim 1 wherein said hybrid read operation is used in a computing device during playback of multimedia content including audio and/or video.

9. The method of claim 1 wherein said hybrid read operation is used in an electronic key reading device during identification of content on an electronic key.

10. The method of claim 1 wherein said hybrid read operation is used in an electronic ticket reading device during identification of content on an electronic ticket.

11. The method of claim 10 wherein said hybrid read operation causes email, photos and videos to be erased after a one time access.

12. The method of claim 11 wherein said buffering is done by a second memory coupled to and on the same integrated circuit as the floating gate based NVM memory device.

13. The method of claim 1 wherein said hybrid read operation is used in a mobile computing device during access of content on such device.

14. The method of claim 1 further including a step: buffering said data after it is read to preserve it for a predetermined period.

15. The method of claim 1 wherein said hybrid read operation is used in a communications circuit for buffering receive and/or transmit data.

16. The method of claim 1 wherein said hybrid read operation is used in a temporary data cache circuit.

17. The method of claim 1 wherein the floating gate based non-volatile memory cell device does not require or use a separate erase immediately prior to programming of cells.

18. The method of claim 1 wherein separate accesses are made to the memory cell during i) and ii) to effectuate achieve both a read and erase operation.

19. The method of claim 1 wherein said sensing occurs over an entire hybrid read operation cycle.

20. A non-volatile floating gate based memory cell device that stores a logic state based on a value of a charge physically present on the floating gate, such that a first amount of charge represents a first logical value, and a second amount of charge represents a second logical value, the device comprising:
a memory array;
a read/write controller circuit adapted to receive and perform a single read command for a hybrid read operation occurring during a hybrid read operation cycle and during which:
i. a read operation of the stored memory cell logic state can be determined during a first phase of the single read command; and
ii. an erase operation of the stored memory cell logic state can be achieved during an immediately subsequent second phase of the single read command;
wherein said hybrid read operation including two different operations can be performed on a memory cell in the memory array during a single access;
iii. sensing of said stored memory cell logical state occurs by integrating a total charge flowing through the device during said hybrid read operation cycle;
wherein said sensing occurs over said entire hybrid read operation cycle;
further wherein a stored logic state of the non-volatile memory cell device can be read at most once before it is erased.

21. The device of claim 20 wherein a threshold voltage of the floating gate based memory cell device is caused to increase during an entirety of said single read access.

22. The device of claim 20 wherein a programming operation for new data of the floating gate based memory cell device does not have to be preceded by an erase operation.

23. A method of operating a floating gate based non-volatile memory cell device that operates to store a logic state based on a value of a charge physically present on the floating gate in a memory cell, such that a first amount of charge represents a first logical value, and a second amount of charge represents a second logical value, the improvement comprising:
a hybrid read operation that when effectuated during a hybrid read operation cycle:
i. reads the stored memory cell logic state during a first phase;

and ii. erases the stored memory cell logic state during an immediately subsequent second phase;

iii. senses said stored memory cell logical state by integrating a total charge flowing through the device during said hybrid read operation cycle for said memory device;

wherein said sensing occurs over said entire hybrid read operation cycle;

further wherein a stored logic state of the non-volatile memory cell device can be read at most once before it is erased.

24. A non-volatile floating gate based memory cell device that stores a logic state based on a value of a charge physically present on the floating gate, such that a first amount of charge represents a first logical value, and a second amount of charge represents a second logical value, the device comprising:

a memory array;

a read/write controller circuit adapted to receive and perform a single hybrid read command for a hybrid read operation occurring during a hybrid read operation cycle and during which:

i. a read operation of the stored memory cell logic state can be determined during a first phase of the single read command; and ii. an erase operation of the stored memory cell logic state can be achieved during an immediately subsequent second phase of the single read command;

wherein two different operations can be performed on a memory cell in the memory array during a single access;

iii. sensing of said stored memory cell logical state occurs by at least one of: 1) integrating a total charge flowing through the device during at least a portion of time of said hybrid read operation; and/or 2) detecting a change in current as a function of at least a portion of time of said hybrid read operation for said memory device;

wherein a threshold voltage of the floating gate based memory cell device is caused to increase during an entirety of said hybrid read operation cycle;

further wherein a stored logic state of the non-volatile memory cell device can be read at most once before it is erased.

* * * * *